United States Patent
Yoneda

(10) Patent No.: US 6,646,608 B2
(45) Date of Patent: Nov. 11, 2003

(54) CENTER ELECTRODE ASSEMBLY, NONRECIPROCAL CIRCUIT DEVICE, COMMUNICATION DEVICE, AND METHOD OF PRODUCING THE CENTER ELECTRODE ASSEMBLY

(75) Inventor: Masayuki Yoneda, Ishikawa-ken (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 10/170,657

(22) Filed: Jun. 14, 2002

(65) Prior Publication Data

US 2003/0006855 A1 Jan. 9, 2003

(30) Foreign Application Priority Data

Jul. 6, 2001 (JP) ........................................ 2001-206898

(51) Int. Cl.⁷ ................................................. H01Q 1/38
(52) U.S. Cl. ............................... 343/700 MS; 333/1.1; 333/24.2; 29/600
(58) Field of Search .................... 343/700 MS; 29/600, 29/601, 603.18, 603.25; 333/1.1, 24.2, 26, 33, 248; H01Q 1/38

(56) References Cited

U.S. PATENT DOCUMENTS

| | | | |
|---|---|---|---|
| 6,363,605 B1 | 4/2002 | Shih et al. | |
| 6,417,741 B2 * | 7/2002 | Jodo | 333/1.1 |
| 6,570,442 B2 * | 5/2003 | Nakai et al. | 330/129 |
| 6,583,681 B1 * | 6/2003 | Makino et al. | 333/1.1 |
| 2001/0035798 A1 | 11/2001 | Jodo | |
| 2002/0079981 A1 | 6/2002 | Tanaka | |
| 2002/0140517 A1 * | 10/2002 | Makino et al. | 333/1.1 |

FOREIGN PATENT DOCUMENTS

| | | |
|---|---|---|
| EP | 0 675 561 A1 | 10/1995 |
| EP | 1 120 796 A2 | 8/2001 |
| GB | 2 269 942 A | 2/1994 |
| JP | 5-37206 | 2/1993 |

* cited by examiner

Primary Examiner—Tho Phan
(74) Attorney, Agent, or Firm—Keating & Bennett, LLP

(57) ABSTRACT

A center electrode assembly includes a substrate made of ferrite, insulation layers made from insulation paste, and a plurality of center electrodes which intersect the insulation layers at predetermined angles. The center electrodes are formed by coating a photosensitive electroconductive paste material, exposing, and firing.

21 Claims, 13 Drawing Sheets

CENTER ELECTRODE ASSEMBLY, NONRECIPROCAL CIRCUIT DEVICE, COMMUNICATION DEVICE, AND METHOD OF PRODUCING THE CENTER ELECTRODE ASSEMBLY

BACKGROUND OF THE INVENTION

1. Field of the Invention

The present invention relates to a center electrode assembly for use, for example, in an isolator, a circulator, or other suitable apparatus to be operated in a microwave band, a nonreciprocal circuit device, a communication device, and a method of producing such a center electrode assembly.

2. Description of the Related Art

A conventional center electrode assembly is described in Japanese Unexamined Patent Application Publication No. 5-37206. The center electrode assembly, as shown in FIG. 17, includes two parallel center electrodes 220a disposed on the upper surface 210a of a ferrite member 210 and the lower surface 210b of the ferrite member 210, using a thermosetting type electroconductive paste material or a firing (baking) type conductive paste material according to a screen printing method. An insulation layer 230 is formed on the upper surface 210a and the lower surface 210b of the ferrite member 210 by screen printing. In this way, the center electrodes 220a and insulation layers 230 are alternately formed. Connecting electrodes 220b are formed on the peripheral side-surface 210c of the ferrite 210 by screen printing. The ends of the connecting electrodes 220b are connected to the ends of the center electrodes 220a, respectively.

Thus, a center conductor 220 is formed, in which three center electrodes 220a are disposed on the upper surface 210a and the lower surface 210b of the ferrite member 210 so as to intersect each other in their insulation state, and the ends of each of the center electrodes 220a are connected to each other through the connecting electrodes 220b. That is, on the upper and lower surfaces 210a and 210b of the ferrite member, center electrodes 220a defining a first layer, a first insulation layer 230, second center electrodes 220a defining a second layer, a second insulation layer 230, and center electrodes 220a defining a third layer are laminated by a screen printing method, respectively. The center electrodes 220a defining the third layer are arranged so as to elongate over the center electrodes 220a as the first and second layers.

However, the screen printing using a thermosetting electroconductive paste material or a firing type electroconductive paste material has a problems in that drooping and blurring are generated during printing, which makes it difficult to produce the center electrodes 220a to have a predetermined width.

In particular, when the center electrodes 220a and the insulation layers 230 are alternately formed, the center electrodes 220a and the insulation layers 230 are partially overlapped on the surface of the ferrite member 210, sequentially, causing the formation of concavities and convexities (step-like differences in height). For this reason, the distance between the surface of the ferrite member 210 and the screen mask becomes different, depending on positions on the screen mask. Thus, drooping or blurring tends to be generated when the center electrodes 220a as the second and third layer are printed. As a result, problems occur because it becomes difficult to obtain the center electrodes 220a having a predetermined width, or the rectangular shapes in the vertical cross-section of the center electrodes 220a become irregular, which causes the insertion loss characteristic of the center electrode assembly.

SUMMARY OF THE INVENTION

In order to overcome the problems described above, preferred embodiments of the present invention provide a center electrode assembly, a nonreciprocal circuit device of which the insertion loss is reduced and the electrical characteristics are greatly improved, a communication device, and a method of producing such a novel center electrode assembly.

According to a preferred embodiment of the present invention, a center electrode assembly includes a substrate, a plurality of center electrodes arranged so as to overlap each other at a predetermined intersecting angle each other, and insulation layers arranged between the center electrodes to insulate the center electrodes from each other, at least the center electrodes being made from a photosensitive electroconductive paste material.

Since the center electrodes are made of the photosensitive electroconductive paste material, the center electrodes having a predetermined width that can be accurately obtained by exposure using a photomask. That is, if differences in height are caused on the surface of the substrate, the center electrodes having a constant electrode width can be securely formed. Moreover, the vertical cross-sections of the center electrodes made from the photosensitive electroconductive paste material become more accurately rectangular compared to the vertical cross-sections of the center electrodes formed by screen printing using a thermosetting type electroconductive paste material or a firing (baking) type electroconductive paste material. In the case of the center electrodes having the rectangular vertical-cross-sections, the distribution of the surface current become more uniform, and the insertion loss of the center electrode assembly is greatly reduced, compared to the center electrodes having vertical cross-sections of which the edges are distorted.

The center electrodes having a width of up to approximately 150 $\mu$m can be produced with high stability and accuracy, and the center electrodes having a large inductance per unit length can be obtained by using the photosensitive electroconductive paste material, since the photosensitive electroconductive paste material is used.

Regarding a high frequency current flowing through the center electrodes, the current flows in a concentrated manner in the surface portions of the center electrodes, due to the skin effect. Accordingly, the conductor loss is greatly reduced by setting the thicknesses of the center electrodes to be at least two times of the skin depth measured at the center frequency in a pass band.

Preferably, a nonreciprocal circuit device of a preferred embodiment of the present invention includes a permanent magnet, the above-described center electrode assembly to which a DC magnetic field is applied via the permanent magnet, and a metallic case which accommodates the permanent magnet and the center electrode assembly. With the above-described configuration, the insertion loss is greatly reduced. The nonreciprocal circuit device having greatly improved electrical characteristics is therefore obtained.

More preferably, the nonreciprocal circuit device further includes a mounting substrate having a matching capacitor element and a resistor element integrally formed therein, and the center electrode assembly is mounted onto the mounting substrate. Thereby, the connecting electrodes of the center electrode assembly can be simply bonded to electrodes on the mounting substrate by soldering or other suitable method. Thus, the production efficiency is greatly improved.

The communication device according to another preferred embodiment of the present invention includes the nonreciprocal circuit device having the above-described characteristics. Thus, the insertion loss is greatly reduced, and the electrical characteristics are greatly improved.

Also, the center electrode assembly having the center electrodes of which the intersecting angles are constant can be efficiently produced. Thus, the center electrode assembly, the nonreciprocal circuit device, and the communication device which achieve excellent performances and are inexpensive can be obtained.

According to another preferred embodiment of the present invention, a method of manufacturing a center electrode assembly includes the steps of coating a photosensitive electroconductive paste material onto substantially the entire main surface of a substrate, exposing, and developing the photosensitive electroconductive paste material to form a center electrode having a predetermined pattern, and coating a photosensitive insulation paste material onto substantially the entire main surface of the substrate, exposing, and developing the photosensitive insulation paste material to form an insulation layer having a predetermined pattern, the step of forming the center electrode and the step of forming the insulation layer being repeated a predetermined number of times, so that the plurality of center electrodes are arranged on the main surface of the substrate so as to form a predetermined intersecting angle with respect to each other with the insulation layers being interposed between the center electrodes.

Moreover, according to preferred embodiments of the present invention, a method of producing a center electrode assembly of the present invention includes the steps of coating a photosensitive electroconductive paste material onto substantially the entire main surface of a substrate, exposing, and developing the photosensitive electroconductive paste material to form a center electrode having a predetermined pattern, and screen-printing insulation paste onto substantially the entire main surface of the substrate, exposing, and developing the insulation paste to form an insulation layer having a predetermined pattern, the step of forming the center electrode and the step of forming the insulation layer being repeated a predetermined number of times, so that the plurality of center electrodes are arranged on the main surface of the substrate so as to form a predetermined intersecting angle with respect to each other with the insulation layers being interposed between the center electrodes.

According to the above-described methods, the center electrode assembly having the above-described characteristics can be produced with very high production efficiency.

Other features, elements, characteristics and advantages of the present invention will become more apparent from the detailed description of preferred embodiments of the present invention with reference to the attached drawings.

DETAILED DESCRIPTION OF PREFERRED EMBODIMENTS

Figure 1:
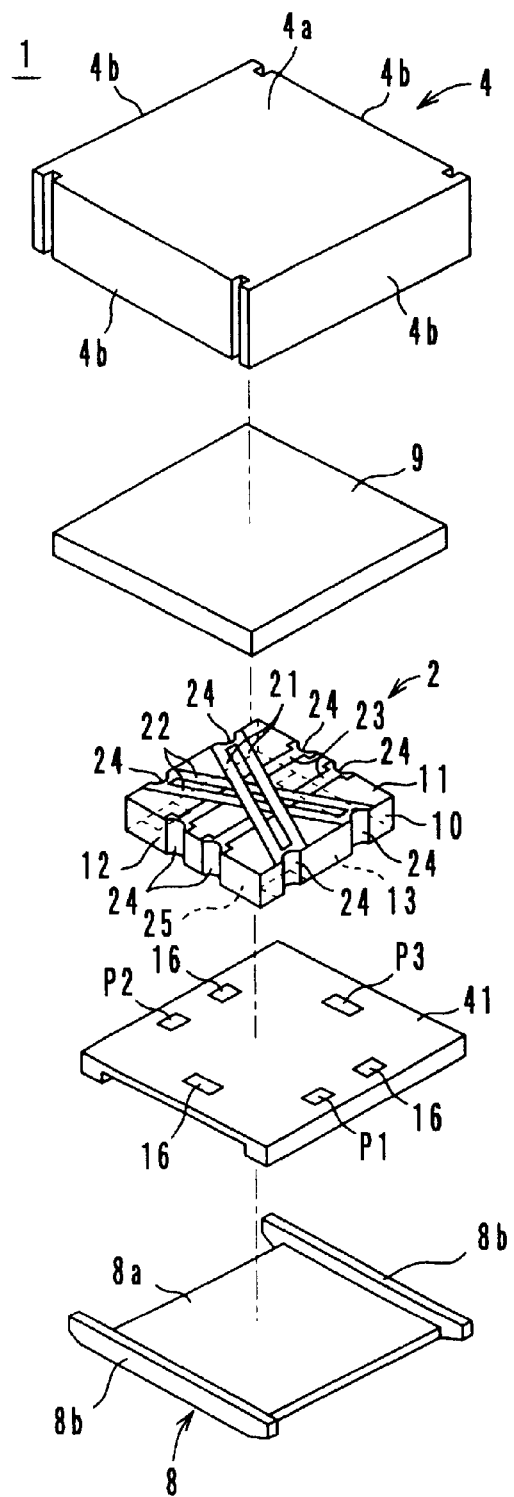
FIG. 1 is an exploded perspective view of a nonreciprocal circuit device according to a preferred embodiment of the present invention.

Hereinafter, a center electrode assembly, a nonreciprocal circuit device, a communication device, and a method of producing the center electrode assembly in accordance with preferred embodiments of the present invention will be described with reference to the accompanying drawings. In the respective preferred embodiments, similar elements or portions are designated by the same reference numerals, and the repeated description is omitted.

FIG. 1 is an exploded perspective view of a nonreciprocal circuit device according to a preferred embodiment of the present invention. A nonreciprocal circuit device 1 is preferably a lumped constant type isolator. As shown in FIG. 1, a lumped constant type isolator 1 preferably includes a mounting substrate 41, a center electrode assembly 2, a substantially rectangular permanent magnet 9, a metallic upper-side case 4, and a metallic lower-side case 8.

The upper-side case 4 has substantially a case-shape configuration, and includes an upper portion 4a and four side portions 4b. The lower-side case 8 includes right and left side portions 8b and a bottom portion 8a. The upper-side case 4 and the lower-side case 8 are preferably made, e.g., of a ferromagnetic material, and the surfaces thereof are plated with Ag or Cu, or other suitable material.

The mounting substrate 41 is preferably an LTCC (Low Temperature Co-fired Ceramic) multi-layer substrate in which matching capacitors C1 to C3 and resistor elements R are provided integrally with the substrate. In the LTCC multilayer substrate, layers made of a low temperature sintering material or a low temperature firing ceramic are laminated with internal conductor films and internal resistor films being interposed between the layers. Also, via-holes are formed in particular layers. The internal conductor films and the internal resistor films are electrically connected to each other inside of the mounting substrate 41 by the via-holes, so that an electric circuit including the resistor elements R and the matching capacitors C1 to C3 is formed (see FIG. 2).

The ceramic multilayer substrate 41 is incapable of shrinking in the main-surface direction (which means a planar direction of the conductor films). In other word, the size of the conductor films that define the capacitance before being fired is not changed as compared with the size of the conductor films that define the capacitance after being fired. Thus, the sizes of the capacitor conductor films of the matching capacitor elements C1 to C3 are not changed as compared with the sizes of that before being fired. Therefore, the capacitances of the matching capacitor elements C1 to C3 have a high accuracy. On the other hand, the center electrodes 21 to 23, made of photosensitive electroconductive paste, have a high dimensional accuracy. Thus, the inductances of the center electrodes 21 to 23 have a high accuracy. Accordingly, the electrical characteristics of the isolator 1 manufactured by using the above-described combination have very low dispersion of electrical characteristics. The acceptance ratio is high, and the manufacturing cost is low.

Port electrodes P1 to P3 and grounding electrodes 16 are exposed at the upper surface of the mounting substrate 41. An input electrode 14 and an output electrode 15 for connecting the isolator 1 to an external circuit are disposed on the lower surface of the mounting substrate 41. Chip capacitor components and coil components may be mounted onto the mounting substrate 41, if necessary.

In the center electrode assembly 2, the three center electrodes 21 to 23 are disposed on a substrate 10 having a substantially rectangular shape and made of a microwave-use ferrite so as to intersect each other at an angle of about 120° with insulation layers 26 (see FIG. 8) being interposed between the center electrodes 21 to 23. The center electrodes 21 to 23 may be arranged in an optional order. In the first preferred embodiment, the center electrode 23, the insulation layer 26, the center electrode 22, the insulation layer 26, and the center electrode 21 are arranged on the upper surface 11 in that order. The ends on one side of each of the center electrodes 21 to 23 are connected to grounding electrodes 25 disposed on the lower surface 13 of the substrate 10 via connecting electrodes 24 disposed on the side surfaces 12 of the substrate 10. The ends on the other sides of the center electrodes 21 to 23 are connected to the port electrodes P1 to P3 via the connecting electrodes 24 disposed on the side surfaces 12 of the substrate 10, respectively. That is, the grounding sides of the center electrodes 21 to 23 are connected to the common grounding electrode 25. The common grounding electrode 25 has substantially the same shape as the lower surface 13 of the substrate 10, and covers substantially the entire surface of the lower surface 13 in such a manner as to avoid contacting with the port electrodes P1 to P3 disposed on the mounting substrate 41. The grounding electrodes 25 are connected to grounding electrodes 16 of the mounting substrate 41.

As a material for the center electrodes 21 to 23 and the grounding electrode 25, a photosensitive electro-conductive paste material including Ag or Cu as a major component is preferably used. Of all the metals, Ag has a lowest resistivity (general value: $1.62 \times 10^{-8}$ Ωm). Thus, the center electrode assembly 2 having a small insertion loss can be obtained. Cu has the lowest resistivity but Ag, and is inexpensive than Ag. Thus, the material cost for the center electrode assembly 2 can be reduced.

As a specific photosensitive electroconductive paste material, Ag—Pt paste containing frits (commercial name: K3714, manufactured by Dupont) is exemplified. Also, paste may be produced by mixing the following composition and kneading by using a three-roll mill. The composition preferably includes about 80% by weight of Ag powder (average grain size of 3 $\mu$m), about 5.0% by weight of $SiO_2$—PbO—$B_2O_3$ type glass powder, about 2.7% by weight of methyl methacrylate—methacrylic acid copolymer, about 3.2% by weight of trimethylol propane triacrylate (monomer), about 0.76% by weight of a polymerization initiator, and about 8.34% by weight of ethyl carbitol acetate (solvent). The viscosities of these photosensitive electroconductive paste materials suffer less time-dependent deterioration. Thus, generation of blurring or other defects in a pattern, which may be caused by the deterioration of the viscosities, is reliably prevented.

Regarding the above-described components, the mounting substrate 41 is incorporated into the lower-side case 8, and the center electrode assembly 2 is disposed (mounted) thereon. The permanent magnet 9 is disposed on the lower side of the upper portion 4a of the permanent magnet 9. Then, the upper side case 4 is attached onto the lower side case 8. The permanent magnet 9 applies a DC magnetic field to the center electrode assembly 2. The lower-side case 8 and the upper side case 4 are bonded to each other to define a metallic case, which constitutes a magnetic circuit and functions as a yoke.

Figure 2:
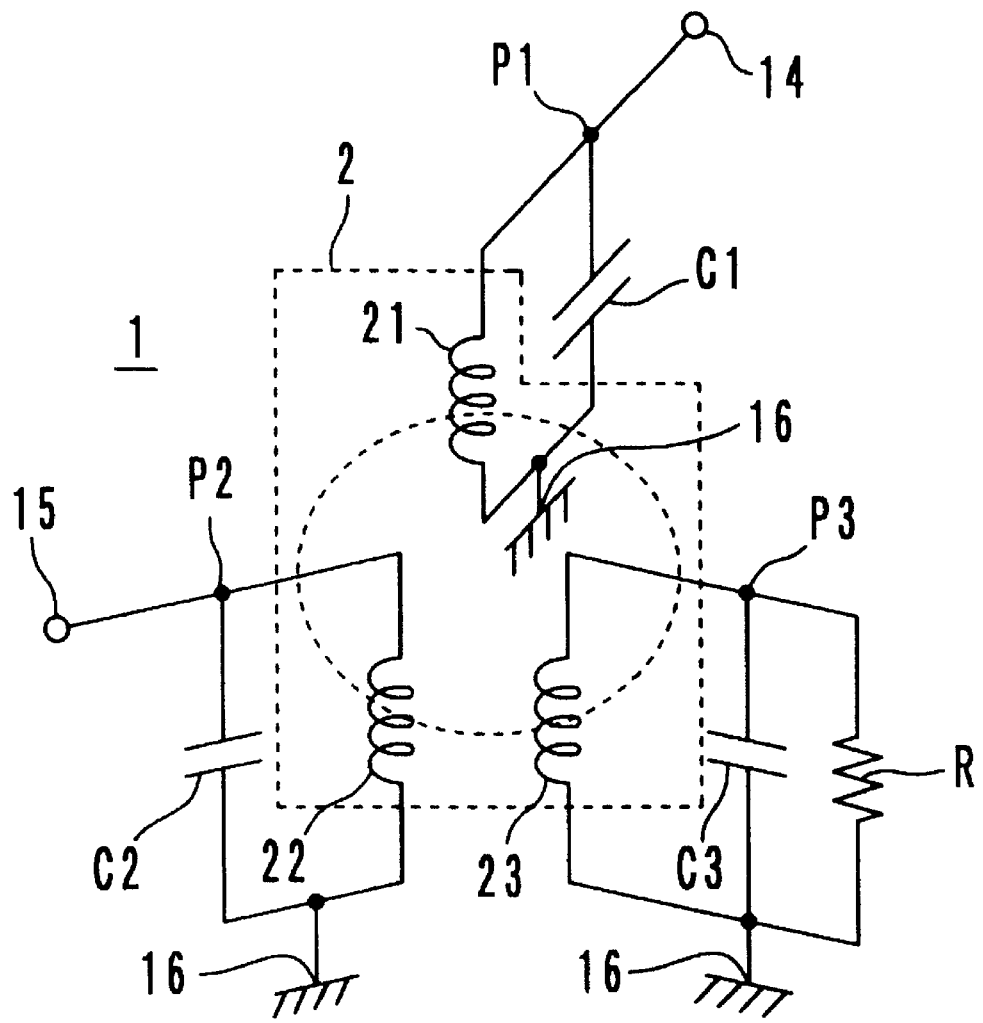
FIG. 2 is an electrical equivalent circuit diagram of the nonreciprocal circuit device of FIG. 1.

Thus, the lumped constant type isolator 1 is obtained. FIG. 2 is an electrical equivalent circuit diagram of the lumped constant type isolator 1.

Figure 3:
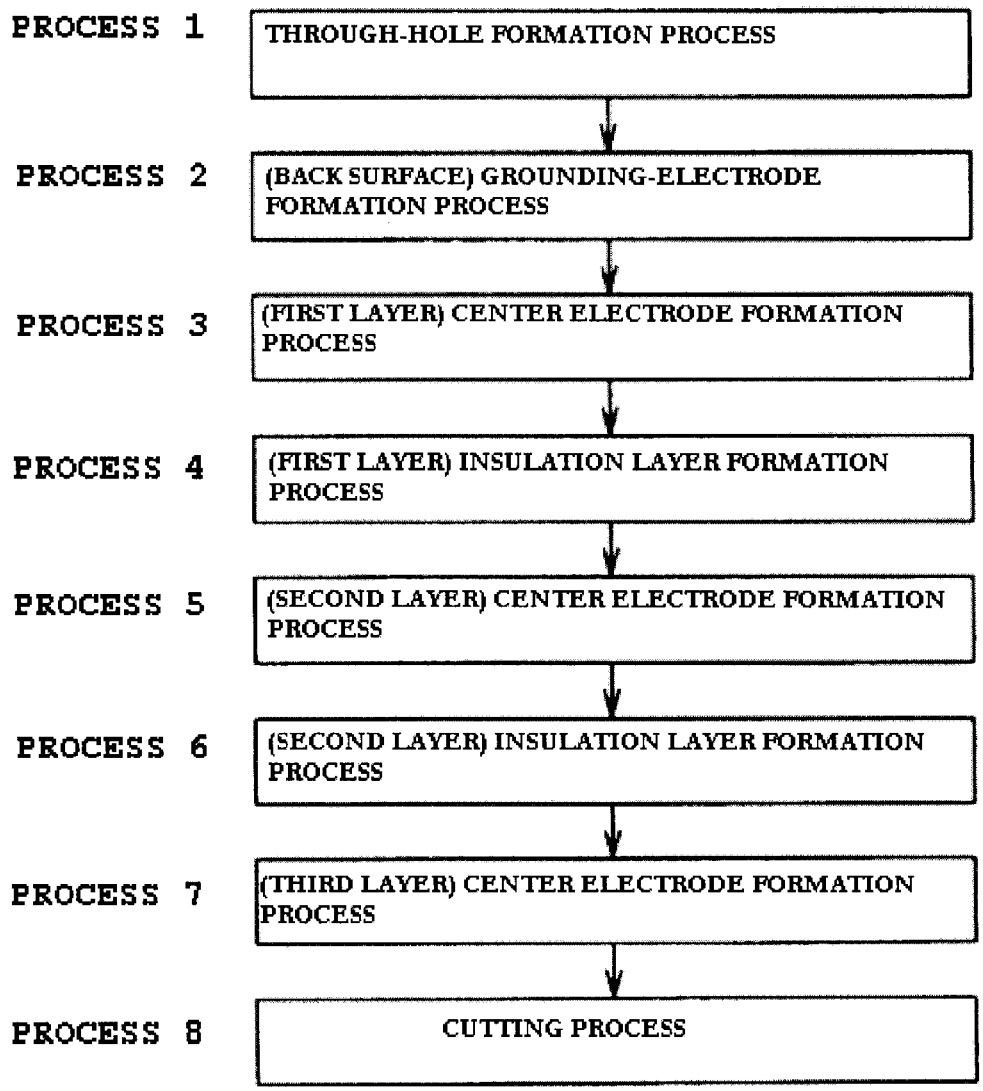
FIG. 3 is a flow chart showing the procedures of a method of producing the center electrode assembly of FIG. 1.
Figure 4:
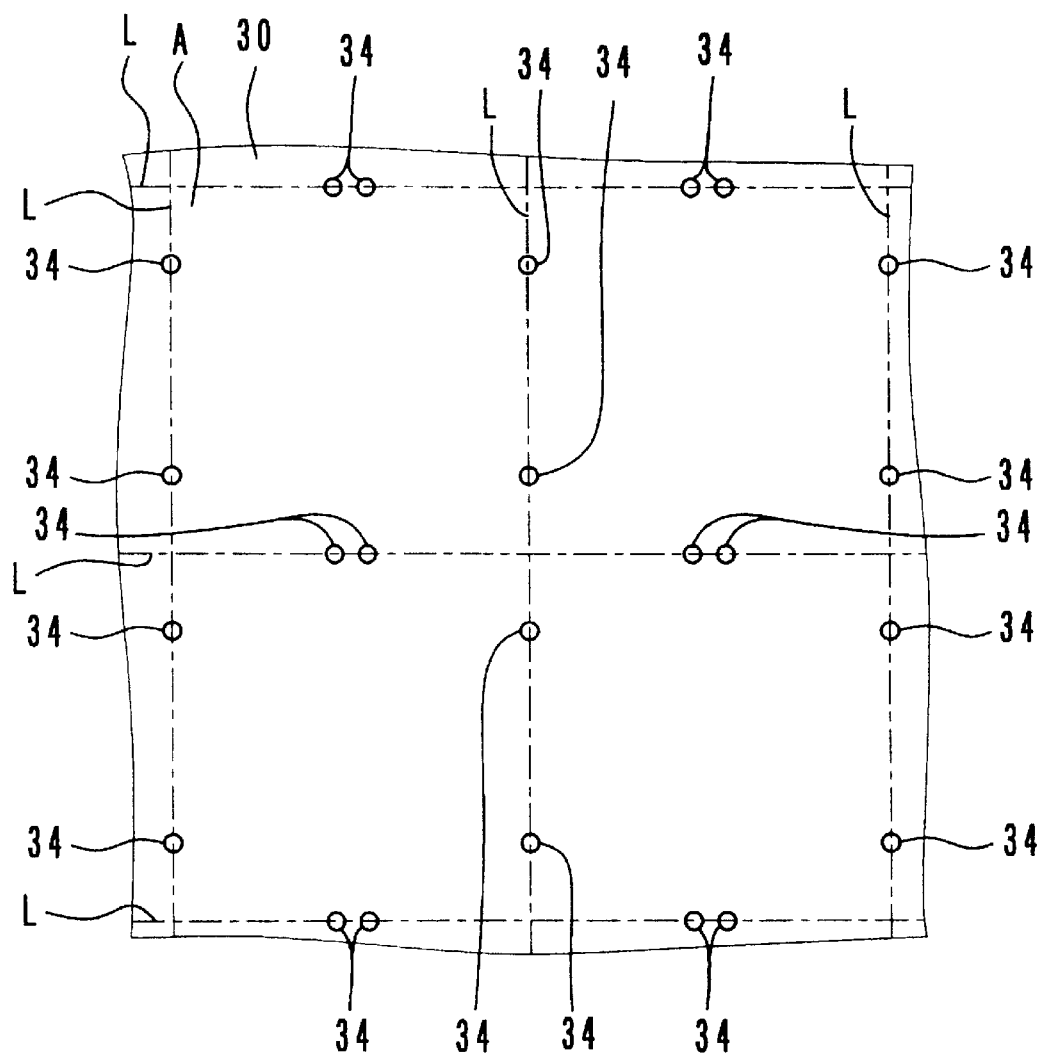
FIG. 4 is a plan view showing the procedures of the method of producing the center electrode assembly of FIG. 1.
Figure 5:
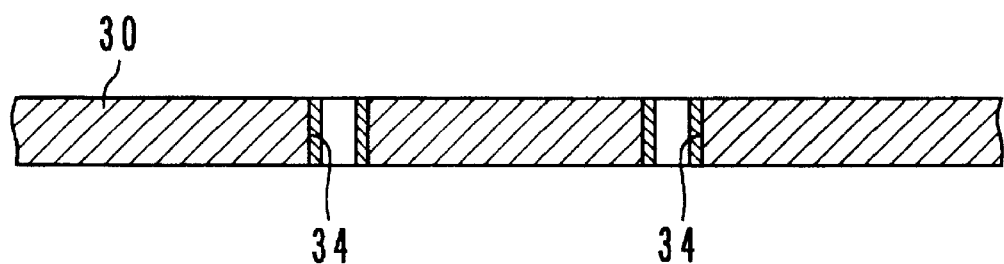
FIG. 5 is a vertical cross-section of a mother substrate shown in FIG. 4.

Hereinafter, the center electrode assembly 2 and an example of a method of producing the center electrode assembly 2 will be described in detail. The center electrode assembly 2 can be inexpensively mass-produced according to the flow chart shown in FIG. 3. First, as shown in FIG. 4, perforations are formed at predetermined positions in the mother substrate 30 made of ferrite and having such a large area that a plurality of center electrode assemblies 2 can be obtained, by laser beam processing, polishing, or other suitable process. The size and shape of the respective perforations are optional, that is, may be substantially rectangular or other suitable shape. In the first preferred embodiment, the perforations preferably have a substantially round-hole shape. Plating films are formed on the inner walls of the perforations, whereby through-holes 34 are formed as shown in FIG. 5 (a process 1 shown in FIG. 3). A photosensitive electroconductive paste material may be filled into the perforations instead of the formation of the plating films on the inner walls of the perforations. In FIG. 4, a long and short dash line L and a range A surrounded by the line L show the cut positions and the range of the size of a product, respectively.

Subsequently, the grounding electrode 25 is formed on the back surface of the mother substrate 30 preferably by a grounding electrode formation process (a process 2 of FIG. 3). That is, a photosensitive electro-conductive paste material is coated onto substantially the entire back surface of the mother substrate 30, and dried. Then, a photomask having a desired pattern drawn thereon is placed so as to cover the coated paste material. Thereafter, UV rays are irradiated for exposure. Then, the photomask is removed. Development and firing are carried out, whereby the grounding electrode 25 having a desired pattern is formed.

Figure 6:
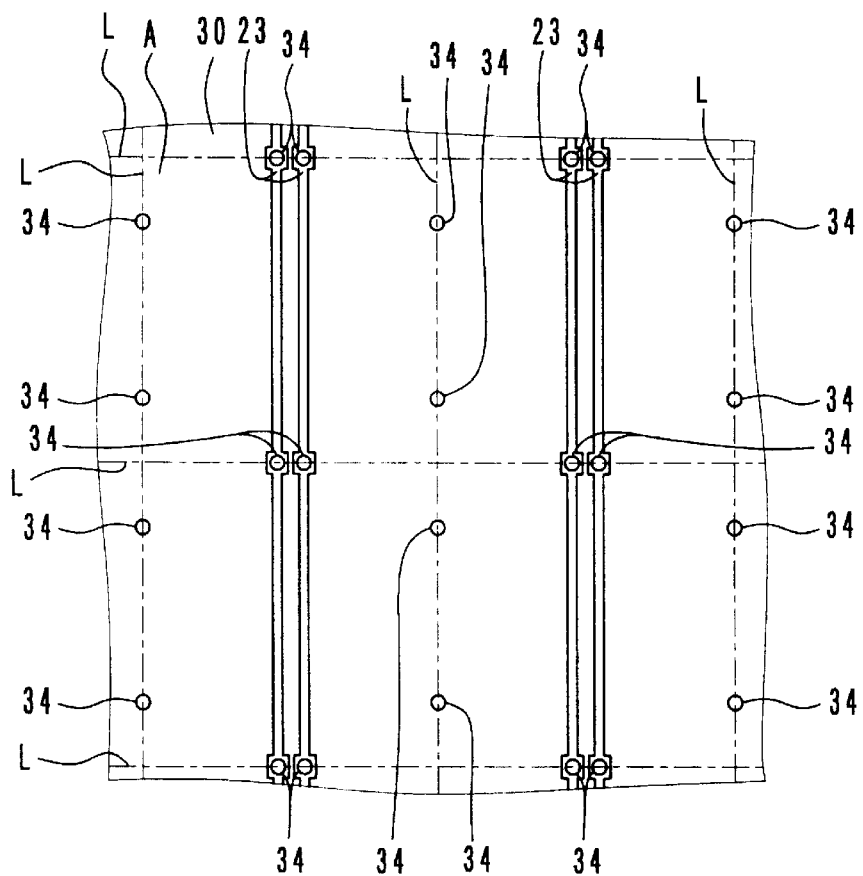
FIG. 6 is a plan view showing the procedures of the method of producing the center electrode assembly succeeding that of FIG. 4.
Figure 7:
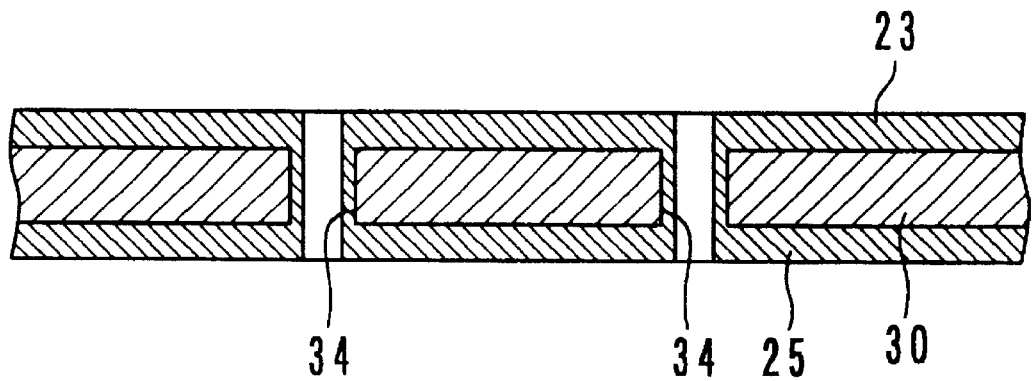
FIG. 7 is a vertical cross-section of the mother substrate of FIG. 6.

Subsequently, as shown in FIG. 6, a pair of the center electrodes 23 is formed on the surface of the mother substrate 30 preferably by a center electrode formation process (a process 3 of FIG. 3). The center electrode formation process is similar to the grounding electrode formation process. That is, a photomask is placed so as to cover, UV rays are irradiated for exposure, and so forth, whereby the center electrodes 23 are formed. As shown in FIG. 7, the center electrodes 23 and the grounding electrode 25 are electrically connected to each other via the through-holes 34. Since the center electrodes 23 and the grounding electrode 25 are electrically connected to each other via the through-holes 34 as described above, the photosensitive electroconductive paste material can be filled into a plurality of the perforations formed in one mother substrate 30 from which the plurality of center electrode assemblies are to be obtained by printing in a single step. That is, so-called multi-processing can be carried out. Thus, the manufacturing cost can be reduced.

Figure 8:
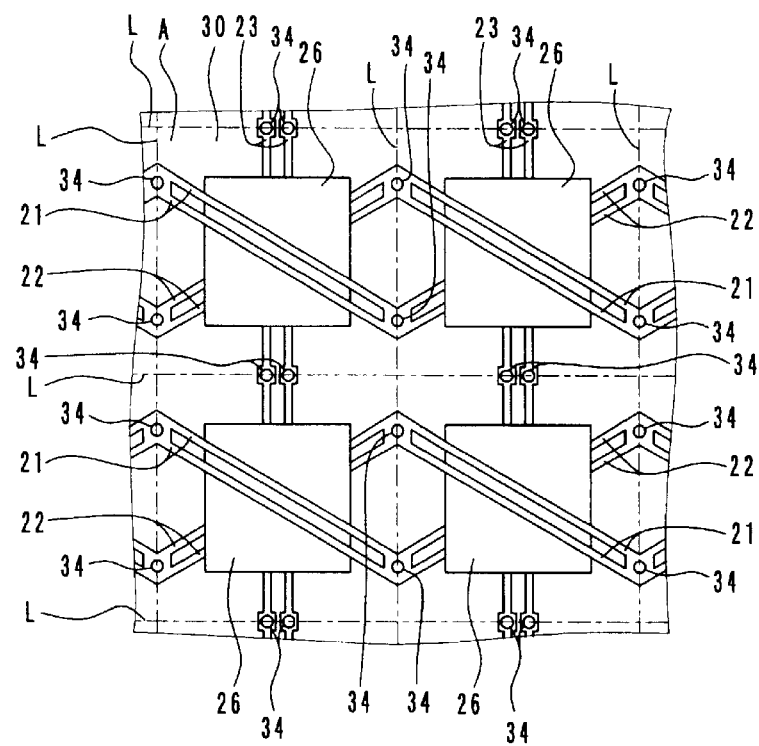
FIG. 8 is a plan view showing the procedures of the method of producing the center electrode assembly succeeding to that of FIG. 6.

Subsequently, as shown in FIG. 8, the insulation layer 26 is formed via an insulation layer formation process (a process 4 of FIG. 3). That is, a screen mask is placed on the surface of the mother substrate 30, and a thermosetting type insulation paste material, a firing type (baking type) insulation paste material or other suitable material is processed preferably using a squeegee, whereby an insulation paste film having a desired pattern is formed in the center of the center electrodes 23 (screen printing). Then, the paste film is dried and heated (firing) to form the insulation layer 26.

Subsequently, the center electrodes 22, the insulation layer 26, and the center electrodes 21 are formed in that order in a manner similar to that of the center electrodes 26 and the insulation layer 26 (processes 5, 6, and 7 of FIG. 3)

Subsequently, the mother substrate 30 is cut along the positions shown by the alternate short and long dash line L, that is, the mother substrate 30 is cut along the line passing through the positions of the through-holes 34 in each individual product (a process 8 of FIG. 3). For the cutting, laser, dicing, or other suitable process is used. The mother substrate 30 is cut to obtain the substrate 10, and simultaneously, each through-hole 34 is divided into two parts, so that the connecting electrodes 24 having a substantially semi-circular shape are formed (see FIG. 1). Thus, the center electrode assembly 2 shown in FIG. 1 is obtained.

Regarding the obtained center electrode assembly 2, the center electrodes 21 to 23 are preferably made from a photosensitive electro-conductive paste material. By exposure using a photomask, the center electrodes 21 to 23 having a predetermined electrode width can be obtained. That is, the center electrodes 21 to 23 and the insulation layers 26 are alternately formed, and thus, concavities and convexities (difference in height) are sequentially formed, caused by partially overlapping of the surfaces of the center electrodes 21 to 23 and the insulation layers 26. However, for the exposure using the photomask, substantially parallel light rays are used, so that the photosensitive electroconductive material can be exposed accurately in conformance with a pattern drawn in the photomask. As a result, even if a difference in height is caused on the surface of the substrate 10, the center electrodes 21 to 23 having a predetermined width can be securely obtained.

Regarding the center electrodes 21 to 23 formed by exposure using the photomask, the obtained vertical cross-sections are more accurately rectangular compared to those of the center electrodes formed by using an ordinary thermosetting type electroconductive paste material or firing type electroconductive paste material. Thus, the obtained center electrode assembly 2 has a smaller insertion loss.

The insertion loss characteristic of the isolator 1 was evaluated. This evaluation is simplified and uses the ferrite 10 with approximate dimensions of 3 mm×3 mm and an electromagnet instead of the permanent magnet 9.

Figure 17:
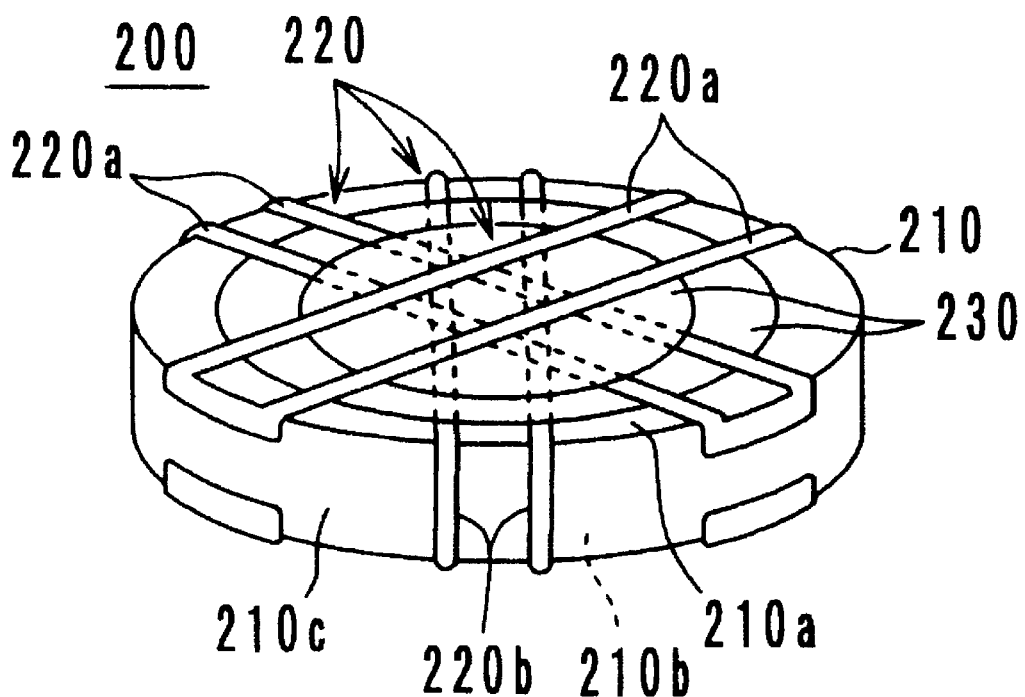
FIG. 17 is a perspective view showing the appearance of a center electrode assembly of the related art.

The isolator 1 was prepared by mounting a center electrode assembly having center electrodes made from a photosensitive electro-conductive paste material including Ag as a major component such as the center electrode assembly 2 shown in FIG. 1. For comparison, two types of isolators of the related art, that is, as shown in FIG. 17, were prepared by mounting a center electrode assembly having center electrodes formed by screen printing an electro-conductive paste material including Ag as a major component (hereinafter, referred to as Comparison 1) and by mounting a center electrode assembly having center electrodes formed by press-punching a metal (Cu) plate (hereinafter, referred to as Comparison 2).

The insertion loss peak values (minimum insertion loss) of these isolators obtained when they were operated in a 800 MHz band were about 0.30 dB for the isolator 1 of the first preferred embodiment of the present invention, about 0.40 dB for Comparison 1, and about 0.29 dB for Comparison 2. As a result, it was seen that the insertion loss peak value of the isolator 1 of the first preferred embodiment was reduced by about 0.10 dB compared to that of Comparison 1 having the center electrodes formed by screen printing. Moreover, the insertion loss peak value of the isolator 1 of the first preferred embodiment was substantially equal to that of Comparison 2 having the center electrodes made of the metal sheet.

Figure 9:
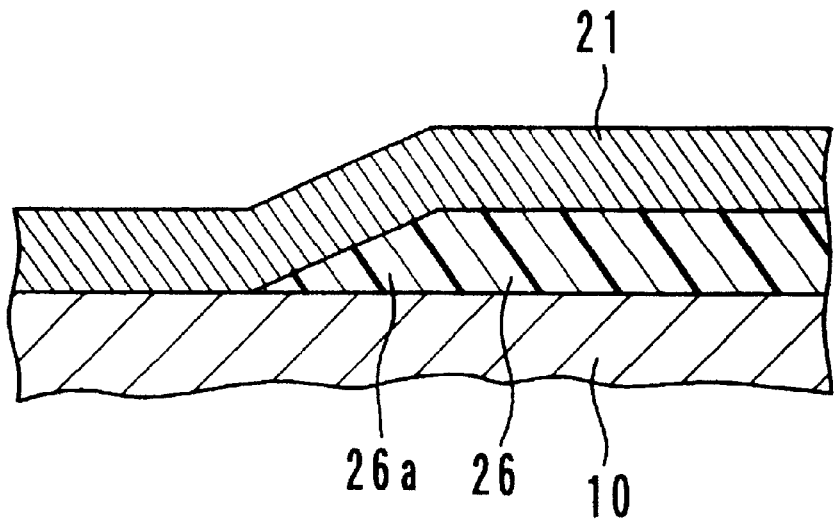
FIG. 9 is a partial vertical cross-section of the mother substrate of FIG. 8.

The insulation layer 26 was formed by screen printing and the end portion 26a of the insulation layer 26 is drooped. Thus, the surface of the end portion 26a of the insulation layer 26 is a mildly sloped surface, as shown in FIG. 9. Accordingly, the end portion 26a of the center electrode 21 can be formed so as to run along the sloped surface. Thus, the electrical characteristic such as insertion loss and others of the center electrodes 21 are greatly improved. Moreover, the center electrode 212 arranged on the insulation layer 26 can be prevented from abruptly bending on the end portion 26a of the insulation layer 26. Thus, the center electrode assembly 2 of which the electrode is prevented from cutting and has a high reliability can be obtained.

The thickness of each of the center electrodes 21 to 23 is preferably about at least two times of the skin depth measured at the center frequency in the pass band. If the thickness of each of the center electrodes 21 to 23 is smaller than two times of the skin depth, the cross-section of each of the center electrodes 21 to 23 through which current flows becomes insufficient, so that the current density is increased with the loss. When the thickness of each of the center electrodes 21 to 23 is two times of the skin depth of each of the center electrodes 21 to 23, the current density at the center in the thickness direction of each of the center electrodes 21 to 23 is reduced to be about 34% of the current density at the surface of each of the center electrodes 21 to 23. Thus, the cross-section of each of the center electrodes 21 to 23 through which current flows is substantially sufficient. For example, the skin depth $\delta$ of each of the center electrodes 21 to 23 is about 2.86 $\mu$m as measured when the material of the electrodes is silver and the center frequency in the pass band is 500 MHz. The skin depth δ can be calculated from the equation: $\delta=(2\rho/(\omega\mu))^{1/2}$, in which ρ represents the resistivity of the center electrodes 21 to 23, μ represents the magnetic permeability thereof, and ω represents the angular frequency at the center frequency. In the first preferred embodiment, the thickness of the center electrodes 21 to 23 is preferably about 3.5 times of the skin depth δ, that is, about 10 μm.

In the case of forming the center electrodes including punching a metal thin sheet in the related art, the widths of the center electrodes can not be reduced to a value of about 150 μm or smaller, due to the precision of a mold machine. In the case of formation the center electrodes using the screen printing, similar problems are caused. On the other hand, the widths of the center electrodes 21 to 23 can be reduced to about 150 μm or smaller by using the photosensitive electro-conductive paste material for the center electrodes 21 to 23. Thereby, the center electrodes 21 to 23 having a large inductance per unit length can be obtained, and the size of the center electrode assembly is greatly reduced.

Figure 10:
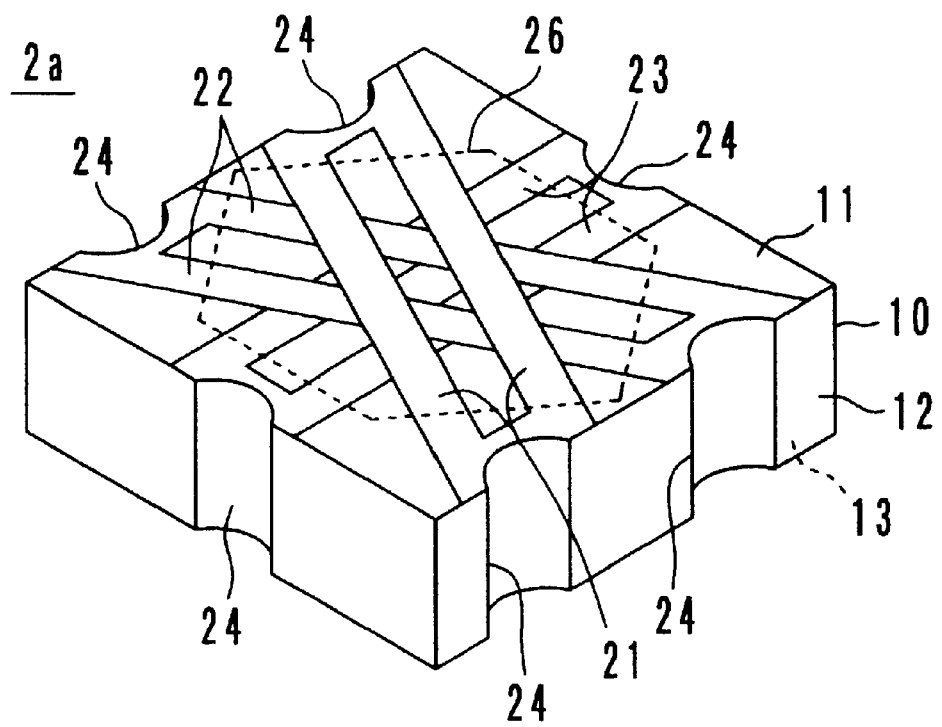
FIG. 10 is a perspective view showing a modification example of the appearance of the center electrode assembly of FIG. 1.
Figure 11:
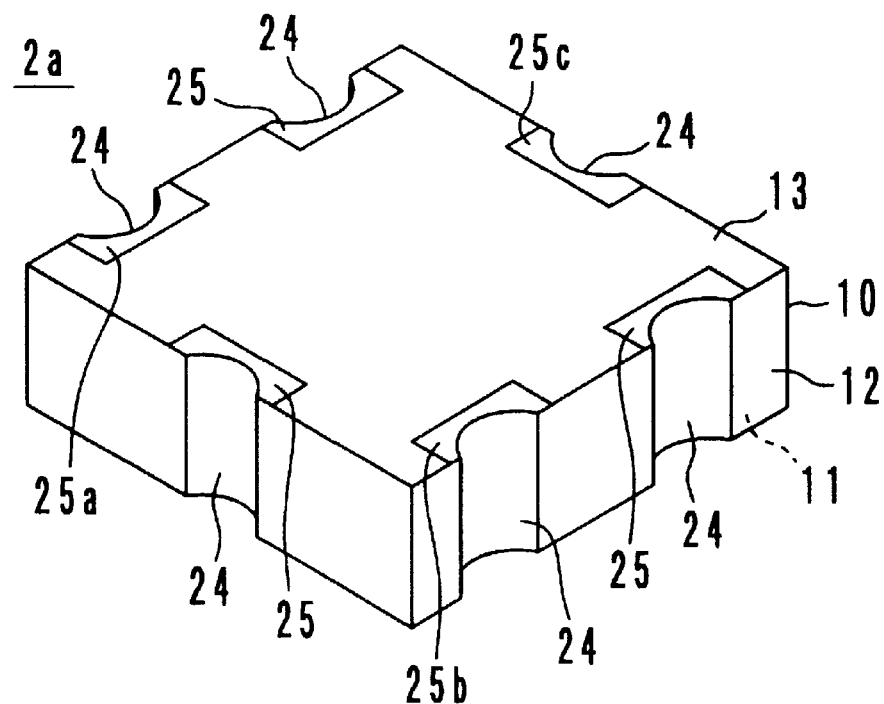
FIG. 11 is a perspective view showing the appearance of the back surface of the center electrode assembly of FIG. 10.

Moreover, the center electrode assembly of various preferred embodiments of the present invention may be differently modified. For example, the center electrode assembly may have very small grounding electrodes 25 disposed on the lower surface 13 such as a center electrode assembly 2a shown in FIGS. 10 and 11. Hot electrodes 25a, 25b, and 25c are formed on the lower surface 13 of the substrate 10 simultaneously in the process of forming grounding electrodes 25, and are electrically connected to the ends on the hot sides of the center electrodes 21 to 23 via connecting electrodes 24, respectively. The hot electrodes 25a, 25b, and 25c are connected to the ports P1 to P3 of the mounting substrate 41, and the grounding electrode 25 is connected to the grounding electrodes 16, respectively.

Figure 12:
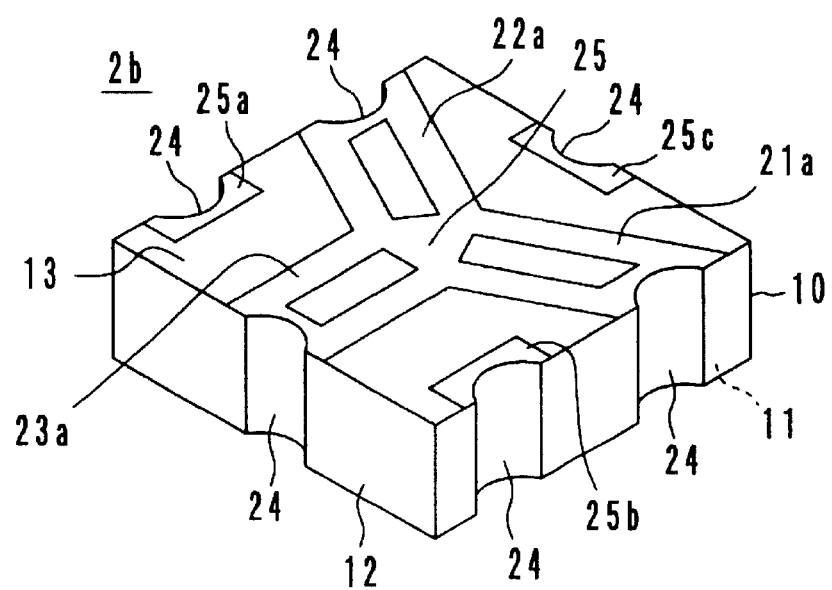
FIG. 12 is a perspective view showing the appearance of a modification example of the center electrode assembly of FIG. 10.

As shown in FIG. 12, the ends on the grounding-sides of the center electrodes 21 to 23 may be extended onto the lower surface 13 of the substrate 10 via the connecting electrodes 24. In this case, in a center electrode assembly 2b, the center electrodes 21a, 22a, and 23a made from the same photosensitive electroconductive paste material as the center electrodes 21 to 23 are formed on the lower surface 13 of the substrate 10. Thus, the center electrodes 21 to 23 formed on the upper surface 11 of the substrate 10 extend to the grounding electrode 25 formed in the center of the lower surface 13. Accordingly, the center electrode assembly 2b is greatly reduced in size.

Figure 13:
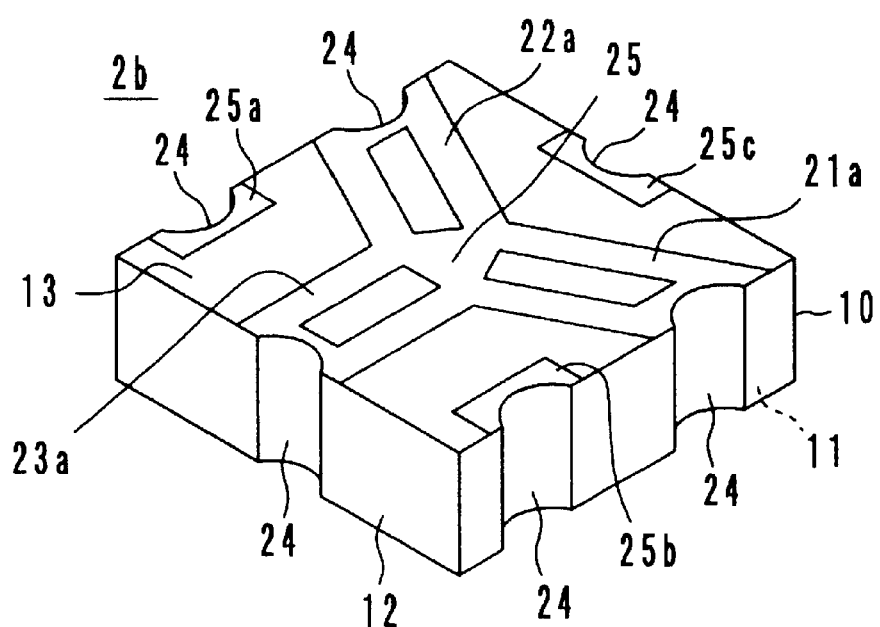
FIG. 13 is a perspective view showing the appearance of a center electrode assembly according to another preferred embodiment of the present invention.
Figure 14:
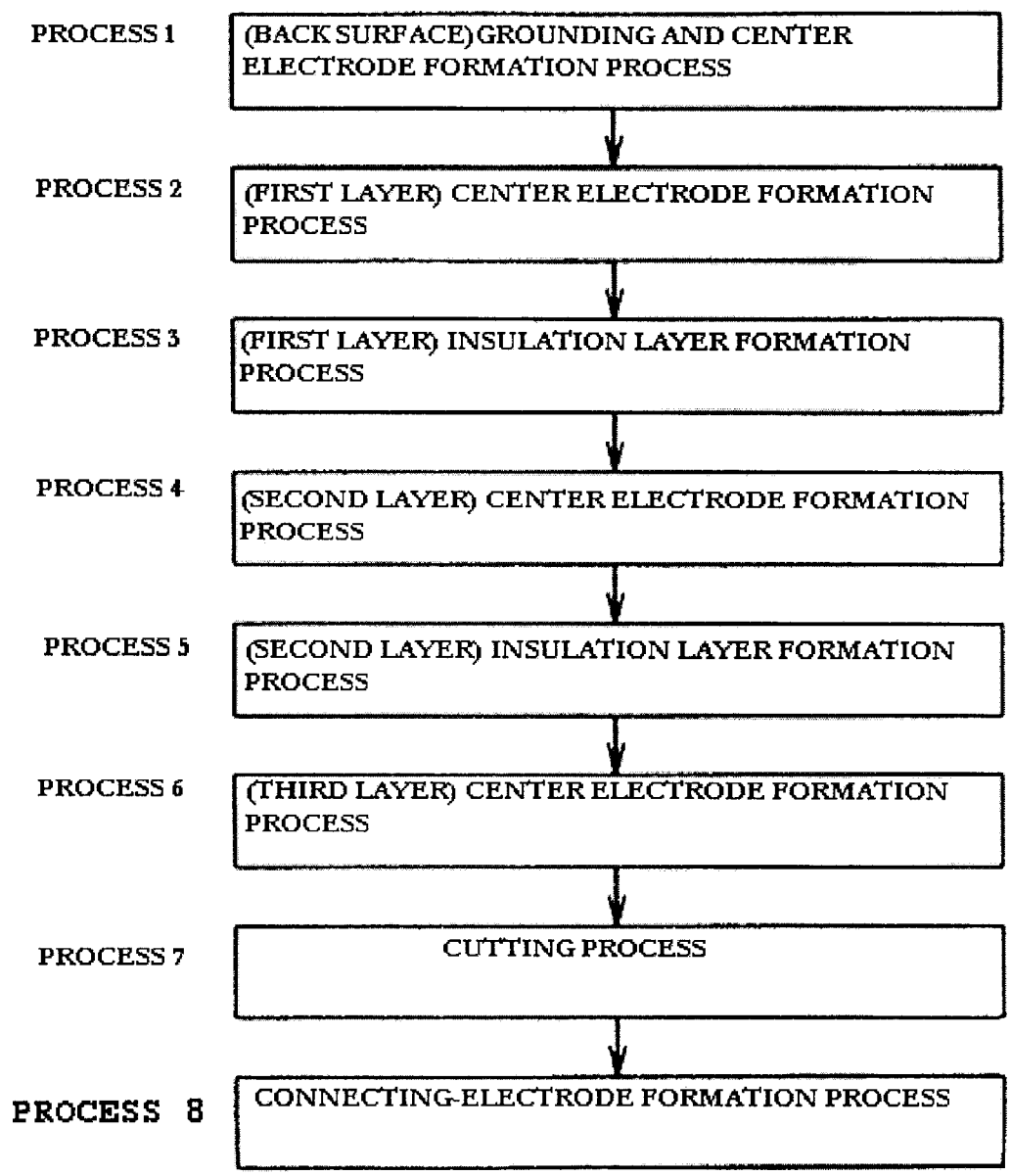
FIG. 14 is a flow chart showing the procedures of the method of producing the center electrode assembly shown in FIG. 13.

As shown in FIG. 13, in a center electrode assembly 2c of the second preferred embodiment, the connecting electrodes 24 are formed directly on the side surfaces 12 of the substrate 10 having no through-holes formed therein.

The center electrode assembly 2c may be produced according to the flow chart shown in FIG. 13, and can be inexpensively mass-produced. First, the grounding electrodes and the center electrodes are formed on the back surface of a mother substrate (process 1). As a material for the grounding electrodes and the center electrodes, a photosensitive electroconductive paste material is preferably used similarly to the above-described first preferred embodiment.

Subsequently, on the surface of the mother substrate, the center electrode 23, the insulation layer 26, the center electrode 22, the insulation layer 26, and the center electrode 21 are formed in that order in the same manner as that for the center electrode 23 and the insulation layer 26 described in the first preferred embodiment (processes 2, 3, 4, 5, and 6). Thereafter, the mother substrate 30 is cut in each individual product (process 7). Thereby, the ferrite member 10 having a dimension of each product is obtained.

Thereafter, the connecting electrodes 24 are formed on the side surfaces of the ferrite member 10 which is formed by cutting the mother substrate 30 (process 8). The connecting electrodes 24 are formed preferably by printing an electro-conductive paste material, transfer-coating to form a thick film, and firing the thick film.

Figure 15:
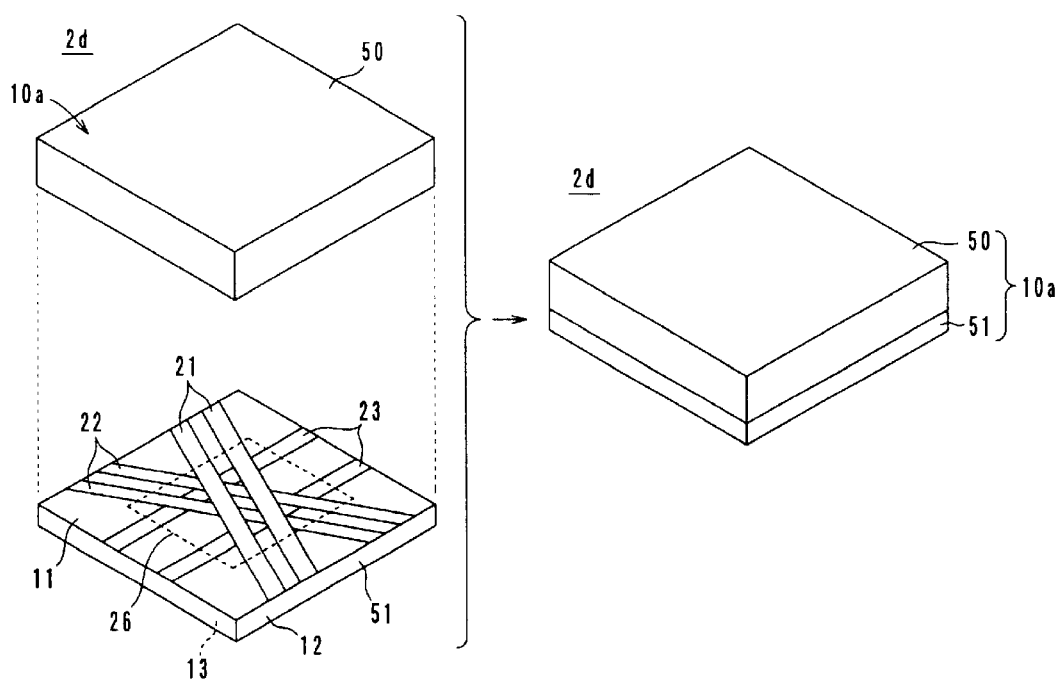
FIG. 15 is a perspective view of a center electrode assembly according to still another preferred embodiment of the present invention.

The above-described center electrode assembly 2c has the same operation and effects as those of the center electrode assemblies 2, 2a, and 2b of the first preferred embodiment. Moreover, a through-hole forming process (a process 1 of FIG. 3) by which the perforations shown in FIG. 4 are formed can be omitted. Thus, the production efficiency of the center electrodes C is even more improved, and the manufacturing cost is greatly reduced, As shown in FIG. 15, the substrate 10 of a center electrode assembly 2d according to a third preferred embodiment includes a ferrite member 50 and the insulation substrate 51. The insulation substrate 51 is preferably made of alumina or other suitable material. The center electrodes 21 to 23 and the insulation layers 20 are formed on the upper surface in a manner similar to that of the first or second preferred embodiment. The insulation substrate 51 and the ferrite member 50 are combined so as to sandwich the center electrodes 21 to 23 and the insulation layers 26. When ferrite is used in the mother substrate 30, problems occur in that the size of the mother substrate 30 has a limitation, the mother substrate 30 is prone to cracking when the electrodes 21 to 25 are printed, and so forth. However, these problems can be avoided by forming the mother substrate 30 using alumina. The reliability of the center electrode assembly 2d is therefore greatly improved.

Herein after, a portable telephone, which is an example of a communication apparatus according to a fourth preferred embodiment of the present invention, will be described.

Figure 16:
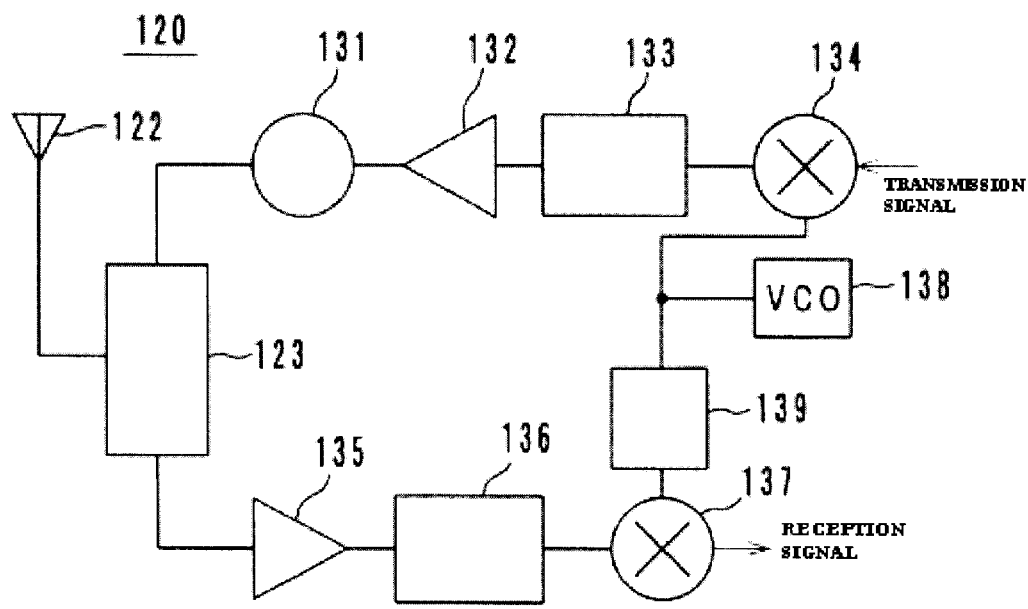
FIG. 16 is an electrical circuit block diagram of a communication device according to another preferred embodiment of the present invention.

FIG. 16 is an electrical circuit block diagram of an RF element of a portable telephone 120. In FIG. 16, an antenna device 122, a duplexer 123, a transmission-side isolator 131, a transmission-side amplifier 132, a transmission-side interstage band-pass filter 133, a transmission-side mixer 134, a reception-side amplifier 135, a transmission-side interstage band-pass filter 133, a transmission-side mixer 134, a reception-side mixer 137, a voltage-control oscillator (VCO) 138, and a local band-pass filter 139 are shown.

As the transmission-side isolator 131, for example, a lumped constant type isolator 1 of the first preferred embodiment can be employed. A portable telephone having superior electrical characteristics can be realized by mounting the isolator 1 therein.

The present invention is not limited to the above-described preferred embodiments, and may be modified without departing from the sprit and scope of the present invention. Needless to say, the present invention may be applied to a circulator and also other high frequency devices. The permanent magnet 9 may have a substantially circular shape, a substantially triangular shape with rounded edges, or the like in addition to the substantially rectangular shape described herein. The intersecting angles of the center electrodes 21 to 23 are preferably within the range of about 110° to about 140°. Moreover, the metallic case may be divided in at least three parts.

The insulation layers 26 of the center electrode assemblies 2, 2a, 2b, 2c, and 2d are preferably formed by screen printing using a thermosetting type insulation paste material, a firing (baking type) insulation paste material, or other suitable material. However, the insulation layers 26 may be formed by a method similar to that for the center electrodes 21 to 23, that is, by coating a photosensitive electroconductive paste material, exposing, and firing. In this case, formation of the center electrodes 21 to 23 and that of the insulation layers 26 are performed in the same process. Thus, the production efficiency of the center electrode assemblies 2, 2a, 2b, 2c, and 2d is greatly improved.

While preferred embodiments of the invention have been described above, it is to be understood that variations and modifications will be apparent to those skilled in the art without departing the scope and spirit of the invention. The scope of the invention, therefore, is to be determined solely by the following claims.

What is claimed is:

1. A center electrode assembly comprising:
   a substrate;
   a plurality of center electrodes arranged on the substrate so as to overlap each other at a predetermined intersecting angle relative to each other; and
   insulation layers arranged between the center electrodes to insulate the center electrodes from each other; wherein
      at least the center electrodes are made from a photosensitive electroconductive paste material.

2. A center electrode assembly according to claim 1, wherein the center electrodes have a width of up to about 150 μm, respectively.

3. A center electrode assembly according to claim 1, wherein the center electrodes have a thickness which is at least two times of the skin depth measured at the center frequency in a pass band, respectively.

4. A center electrode assembly according to claim 1, wherein the substrate is made of ferrite.

5. A center electrode assembly according to claim 1, wherein the substrate includes a ferrite member and an insulation substrate, and the center electrodes are provided on a main surface of the insulation substrate.

6. A nonreciprocal circuit device comprising:
   a permanent magnet;
   the center electrode assembly according to claim 1 to which a DC magnetic field is applied from the permanent magnet; and
   a metallic case which accommodates the permanent magnet and the center electrode assembly.

7. A nonreciprocal circuit device according to claim 6, wherein the center electrodes are arranged on one main surface of the substrate, an electrode is arranged on the other main surface of the substrate, and the electrodes on both of the main surfaces are connected to each other via through-holes.

8. A nonreciprocal circuit device according to claim 6, wherein the center electrodes are arranged on one main surface of the substrate, an electrode is arranged on the other main surface of the substrate, and the electrodes on both of the main surfaces are connected to each other via thick-film electrodes disposed on the side surfaces of the substrate.

9. A nonreciprocal circuit device according to claim 6, wherein the device further comprises a mounting substrate having a matching capacitor element and a resistor element integrally disposed therein, and the center electrode assembly is mounted onto the mounting substrate.

10. A nonreciprocal circuit device according to claim 9, wherein the mounting substrate is a ceramic multilayer substrate which is incapable of shrinking in the main surface direction.

11. A communication device including the nonreciprocal circuit device according to claim 6.

12. A method of producing a center electrode assembly comprising the steps:
   coating a photosensitive electroconductive paste material onto substantially an entire main surface of a substrate, exposing and developing the photosensitive electroconductive paste to form a center electrode having a predetermined pattern; and
   coating a photosensitive insulation paste material onto substantially the entire main surface of the substrate, exposing and developing photosensitive insulation paste material to form an insulation layer having a predetermined pattern; wherein
      the step of forming the center electrode and the step of the forming the insulation layer is repeated a predetermined number times, so that the plurality of center electrodes are arranged on the main surface of the substrate so as to form predetermined intersecting angles relative to each other with the insulation layers being interposed between the center electrodes.

13. The method according to claim 12, wherein the center electrodes have a width of up to about 150 μm, respectively.

14. The method according to claim 12, wherein the center electrodes have a thickness which is at least two times of the skin depth measured at the center frequency in a pass band, respectively.

15. The method according to claim 12, wherein the substrate is made of ferrite.

16. The method according to claim 12, wherein the substrate includes a ferrite member and an insulation substrate, and the center electrodes are provided on a main surface of the insulation substrate.

17. A method of producing a center electrode assembly comprising the steps:
   coating a photosensitive electroconductive paste material onto substantially an entire main surface of a substrate, exposing and developing the photosensitive electroconductive paste to form a center electrode having a predetermined pattern; and
   screen-printing insulation paste onto substantially the entire main surface of the substrate, exposing and developing the insulation paste to form an insulation layer having a predetermined pattern;
   the step of forming the center electrode and the step of forming the insulation layer being repeated a predetermined number of times, so that the plurality of center electrodes are arranged on the main surface of the substrate so as to form predetermined intersecting angles relative to each other with the insulation layers being interposed between the center electrodes.

18. The method according to claim 17, wherein the center electrodes have a width of up to about 150 μm, respectively.

19. The method according to claim 17, wherein the center electrodes have a thickness which is at least two times of the skin depth measured at the center frequency in a pass band, respectively.

20. The method according to claim 17, wherein the substrate is made of ferrite.

21. The method according to claim 17, wherein the substrate includes a ferrite member and an insulation substrate, and the center electrodes are provided on a main surface of the insulation substrate.

* * * * *